United States Patent
Wu et al.

(10) Patent No.: US 9,130,329 B1
(45) Date of Patent: Sep. 8, 2015

(54) CONNECTOR AND ASSEMBLY METHOD FOR TRANSMISSION ASSEMBLY OF CONNECTOR

(71) Applicant: Telebox Industries Corp., Hsichih-Taipei (TW)

(72) Inventors: Fu-Wen Wu, Keelung (TW); Su-Hui Huang, Keelung (TW); Ching-Yi Hsu, New Taipei (TW)

(73) Assignee: TELEBOX INDUSTRIES CORP., Taipei (TW)

( * ) Notice: Subject to any disclaimer, the term of this patent is extended or adjusted under 35 U.S.C. 154(b) by 49 days.

(21) Appl. No.: 14/199,663

(22) Filed: Mar. 6, 2014

(51) Int. Cl.
*H01R 24/00* (2011.01)
*H01R 24/64* (2011.01)
*H01R 13/6466* (2011.01)
*H05K 3/30* (2006.01)

(52) U.S. Cl.
CPC ............ *H01R 24/64* (2013.01); *H01R 13/6466* (2013.01); *H05K 3/303* (2013.01)

(58) Field of Classification Search
CPC ........................... H01R 23/025; H01R 23/005
USPC ........................ 439/676, 941, 670.1
See application file for complete search history.

(56) References Cited

U.S. PATENT DOCUMENTS

| | | | | |
|---|---|---|---|---|
| 5,634,802 A | * | 6/1997 | Kerklaan | 439/131 |
| 5,660,568 A | * | 8/1997 | Moshayedi | 439/654 |
| 6,905,351 B1 | * | 6/2005 | Wang et al. | 439/131 |
| 6,971,921 B1 | * | 12/2005 | Lai | 439/676 |
| 7,040,927 B1 | | 5/2006 | Liu | |
| 8,052,482 B1 | | 11/2011 | Lin | |
| 8,496,500 B1 | | 7/2013 | Wu | |
| 2005/0189566 A1 | | 9/2005 | Matsumoto et al. | |
| 2010/0151707 A1 | | 6/2010 | AbuGhazaleh et al. | |
| 2011/0212652 A1 | * | 9/2011 | Schmidt et al. | 439/660 |
| 2013/0337687 A1 | * | 12/2013 | Weinmann et al. | 439/620.01 |

FOREIGN PATENT DOCUMENTS

EP      2 487 761 A1    8/2012

OTHER PUBLICATIONS

Extended European Search Report dated Aug. 21, 2014 as received in Application No. 14 15 8703.

* cited by examiner

*Primary Examiner* — Phuongchi T Nguyen
(74) *Attorney, Agent, or Firm* — Maschoff Brennan (57) ABSTRACT

A connector includes an insulated housing having a slot and a transmission assembly located inside the insulated housing. The transmission assembly includes a main circuit board, an expanded circuit board, a plurality of first terminals and at least one second terminal. The expanded circuit board is stacked on the main circuit board and a first lateral side and a second lateral side of the expanded circuit board which are opposite to each other has a plurality of first electrical contacts and at least one second electrical contact, respectively. The first terminals and the at least one second terminal are plugged in the main circuit board. One ends of the first terminals are in electrical contact with the first electrical contacts respectively. The other ends of the first terminals bend and extend towards the second lateral side of the expanded circuit board.

10 Claims, 8 Drawing Sheets

CONNECTOR AND ASSEMBLY METHOD FOR TRANSMISSION ASSEMBLY OF CONNECTOR

TECHNICAL FIELD

The disclosure relates to a connector, more particularly to a connector with an expanded circuit board and an assembly method for a transmission assembly of a connector.

BACKGROUND

The related industries have been improving the high-speed transmission of telecommunication signals for providing internet users a better network environment. Nowadays the transmission speed of a C6A RJ45 connector is 500 MHz. However, as the transmission speed increases, the impacts of crosstalk grow. This worsens the transmission quality of the RJ45 connector. In other words, crosstalk is obstacle to improve the transmission speed of the RJ45 connector.

Since today's transmission speed of the RJ45 connector is much faster than the speed of 250 MHz in the early RJ45 connector, sorting terminals and changing locations are no longer effective in terms of restraining crosstalk. Hence, the designers need to utilize noise-suppression components, such as resistance or capacitance, to improve the suppression of crosstalk. Nevertheless, the space of the circuit board inside the RJ45 connector is limited, so the space is insufficient to dispose a circuit for the suppression of crosstalk. Therefore, it is important to arrange a space in the RJ45 connector for disposing the circuit, so that the circuit for the suppression of crosstalk can be disposed thereon in order to reduce the impact of crosstalk.

SUMMARY

A connector comprises an insulated housing having a slot and a transmission assembly located inside the insulated housing. The transmission assembly comprises a main circuit board, an expanded circuit board, a plurality of first terminals and at least one second terminal. The expanded circuit board is stacked on the main circuit board and a first lateral side and a second lateral side of the expanded circuit board which are opposite to each other has a plurality of first electrical contacts and at least one second electrical contact, respectively. The first terminals and the at least one second terminal are plugged in the main circuit board. One ends of the first terminals are in electrical contact with the first electrical contacts respectively. The other ends of the first terminals bend and extend towards the second lateral side of the expanded circuit board. One end of the at least one second terminal is in electrical contact with the at least one second electrical contact. The other end of the second terminal bends and extends towards the first lateral side of the expanded circuit board, while the other end of the second terminal is pressed against one side of the expanded circuit board away from the main circuit board, thereby fixing the expanded circuit board to the main circuit board and making the expanded circuit board and the main circuit board be electrically connected to each other.

An assembly method for a transmission assembly of a connector comprises steps of: plugging a plurality of first terminals in a main circuit board; plugging at least one second terminal in the main circuit board; stacking an expanded circuit board on the main circuit board, wherein a first lateral side and a second lateral side of the expanded circuit board which are opposite to each other has a plurality of first electrical contacts and at least one second electrical contact, respectively, and the expanded circuit board is disposed between the first terminals and the second terminal; bending the first terminals so that the first terminals each forms a first limit section and a first contact section, wherein the first limit sections are in electrical contact with the first electrical contacts, respectively, and the first contact sections extend towards the second lateral side; and bending the second terminal so that it forms a second limit section and a second contact section, wherein the second limit section is in electrical contact with the second electrical contact, while the second contact section extends towards the first lateral side and is pressed against one side of the expanded circuit board away from the main circuit board.

BRIEF DESCRIPTION OF THE DRAWINGS

The present disclosure will become more fully understood from the detailed description given hereinbelow, along with the accompanying drawings which are for illustration only, thus are not limitative of the present disclosure, and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
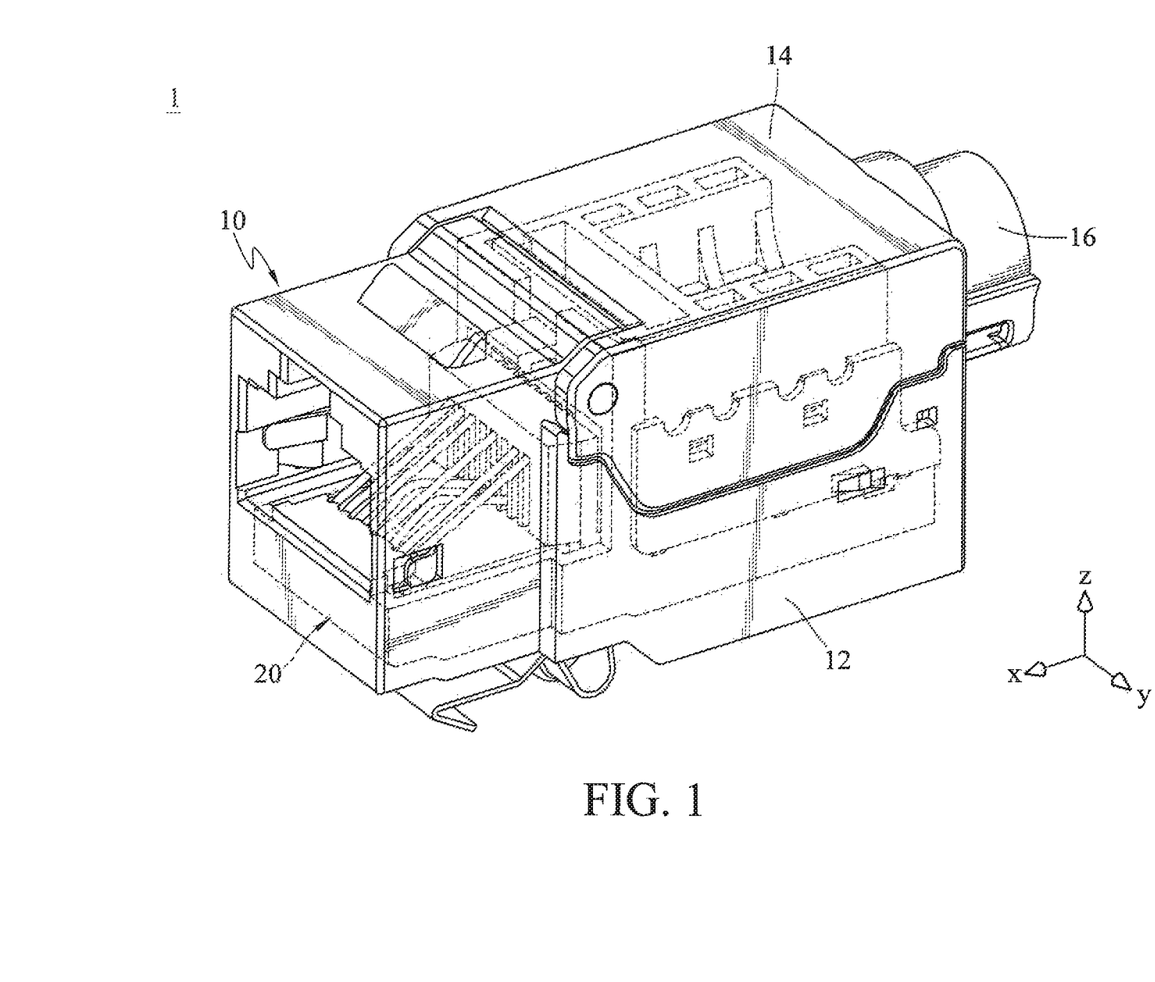
FIG. 1 is a perspective view of a connector according to the first embodiment of the disclosure.
Figure 2:
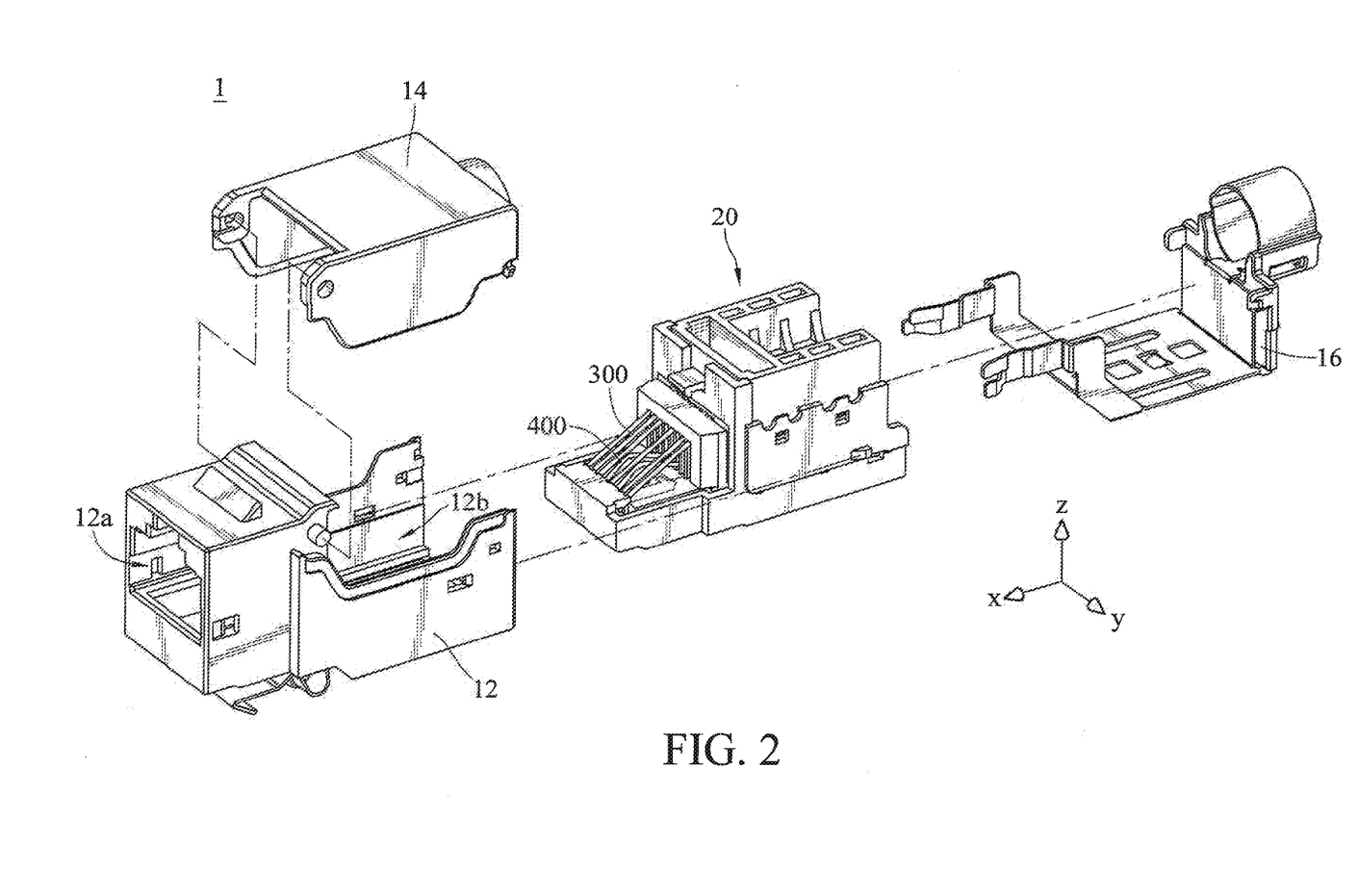
FIG. 2 is an exploded view of FIG. 1.
Figure 3:
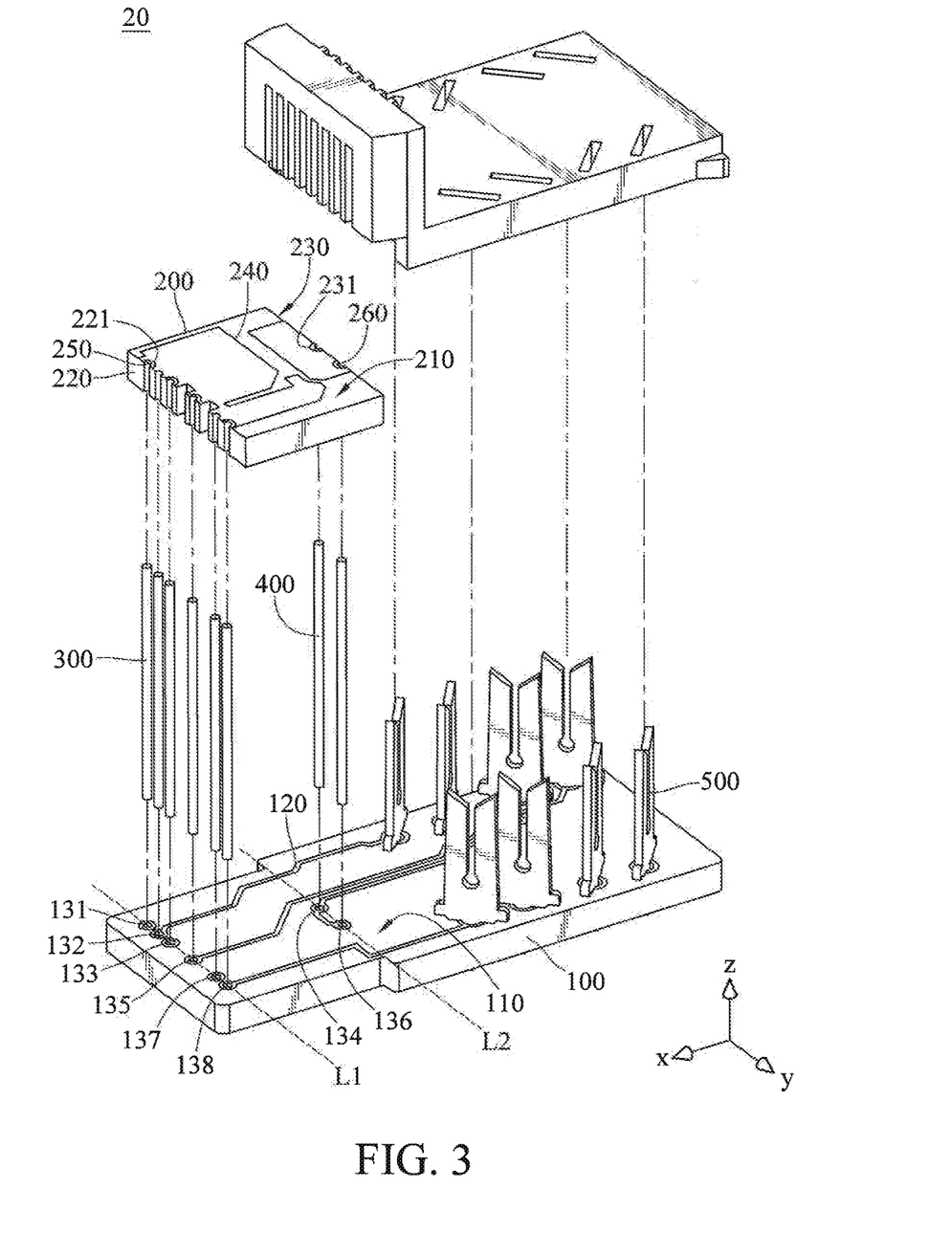
FIG. 3 is an exploded view of the transmission assembly of FIG. 2.
Figure 4:
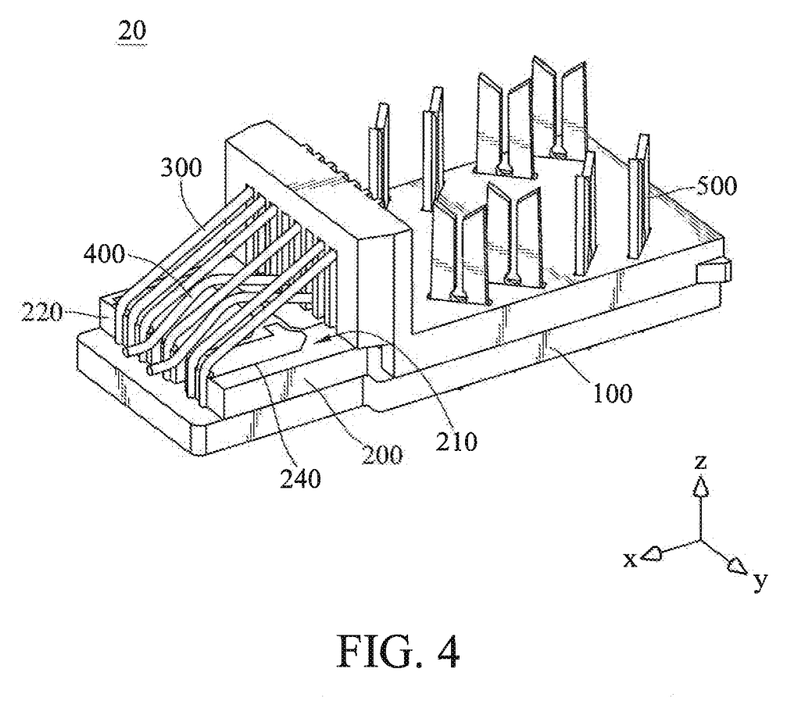
FIG. 4 is a schematic view of the assembly of FIG. 3.

FIG. 1 is a perspective view of a connector according to the first embodiment of the disclosure; FIG. 2 is an exploded view of FIG. 1; FIG. 3 is an exploded view of the transmission assembly of FIG. 2; FIG. 4 is a schematic view of the assembly of FIG. 3. As seen in FIG. 1 to FIG. 4, in this embodiment, a connector 1 (e.g. A RJ45 connector) comprises an insulated housing 10 and a transmission assembly 20. The insulated housing 10 comprises a main body 12, a top cover 14 and a back cover 16. The main body 12 has a slot 12a and an accommodating notch 12b. The slot 12a is configured for being plugged in by another connector (not shown in the figures). The accommodating notch 12b connects to the slot 12a, and the transmission assembly 20 is located in the accommodating notch 12b. The top cover 14 is installed on the main body 12 and covers the transmission assembly 20. A back cover 16 is installed on the main body 12 while the back cover 16 and the main body 12 abut on two opposite sides of the main circuit board 100.

The transmission assembly 20 comprises a main circuit board 100, an expanded circuit board 200, a plurality of the first terminal 300, at least one the second terminal 400 and a plurality of the piercing terminals 500.

The main circuit board 100 has a surface 110 and a transmission circuit 120 located on the surface 110.

The expanded circuit board 200 is stacked on the surface 110 and has a top surface 210, a first lateral side 220, a second lateral side 230, an expanded circuit 240, a plurality of the first electrical contact 250, two second electrical contacts 260 and a transmission circuit 120. The first lateral side 220 and the second lateral side 230 are connected to opposite two sides of the top surface 210, respectively. The first lateral side 220 has a plurality of the first recessed portions 221, while the second lateral side 230 has two second recessed portions 231.

The expanded circuit 240 is disposed on the top surface 210. The expanded circuit 240 is, for example, a noise suppression circuit.

The first electrical contact 250 and the second electrical contact 260 are, for example, metal films and are electrically connected to the expanded circuit 240 respectively. These first electrical contacts 250 are formed on the wall surface of these first recessed portions 221. The two first electrical contacts 250 are formed on the wall surface of the two first recessed portions 221, respectively. The two first electrical contacts 250 are formed on the wall surface of the two second recessed portions 231, respectively. In this embodiment, the number of the first electrical contacts 250 is six, while the number of the second electrical contacts 260 is two, but the disclosure is not limited thereto. In other embodiments, the numbers of the first electrical contacts 250 and the second electrical contacts 260 can be any numbers as long as the sum of them is eight.

In this embodiment, the number of the first terminals 300 is six and these first terminals 300 are arranged along a first line L1. Each first terminal 300 bends and forms a first limit section 310 and a first contact section 320. One end of the first limit section 310 is plugged in the main circuit board 100, while the other end is in electrical contact with the first electrical contact 250, for expanding the freedom of movement of the expanded circuit board 200 along a horizontal direction (namely positive x-axis direction). These first contact sections 320 extend from the first limit section 310 towards the second lateral side 230, and an obtuse angle is formed between the first contact section 320 and the first limit section 310.

The number of the second terminals 400 is two and theses two second terminals 400 are arranged along a second line L2 parallel to the first line L1. Each second terminal 400 bends and forms a second limit section 410 and a second contact section 420. One end of the second limit section 410 is plugged in the main circuit board 100, while the other end is in electrical contact with the second electrical contact 260, for expanding the freedom of movement of the expanded circuit board 200 along another horizontal direction (namely negative x-axis direction). These second contact sections 420 bend and extend from the second limit section 410 towards the first lateral side 220 and is pressed against the top surface 210 of the expanded circuit board 200 for limiting the freedom of movement of the expanded circuit board 200 along a vertical direction (namely z-axis direction)

In this embodiment, the first contact section 320 and the second contact section 420 are exposed from the slot 12a and are in electrical contact with another connector (not shown in the figures). To prevent them from hindering connection, the height of the end of the second contact section 420 away from the first limit section 310 is designed to be lower than the top surface 210 of the expanded circuit board 200.

Moreover, each first electrical contact 250 is formed on each first recessed portion 221 while each second electrical contact 260 is formed on each second recessed portion 231. When each first terminal 300 is in electrical contact with each first electrical contact 250, the first terminal 300 is also fastened with each first recessed portion 221. Additionally, when the two second terminals 400 are in electrical contact with the two second electrical contacts 260, the two second terminals 400 are also fastened with the two second recessed portions 231, thereby limiting the freedom of movement of the expanded circuit board 200 along another horizontal direction (namely negative y-axis direction).

In this embodiment, the number of the first terminals 300 is six while the number of the second terminals 400 is two, but they are not limited thereto. In other embodiments, the numbers of the first terminal 300 and the second terminal 400 can be any numbers as long as the sum of them is eight.

The plurality of the piercing terminal 500 is plugged in the main circuit board 100, and is electrically connected to each first terminal 300 and the two second terminals 400 respectively, via the transmission circuit 120. These piercing terminals 500 are used for being plugged by a transmission cable (not shown). When the transmission cable is plugged in the piercing terminal 500, the piercing terminal 500 pierces the insulation surface of the transmission cable for direct electrical connection with the conductive circuit on the outer part of the transmission cable.

According to the above-mentioned structure, fixing and electrical connection can be achieved via the first limit section 310 of each first terminal 300, the first contact section 320, the second limit section 410 of each second terminal 400 and the second contact section 420. Thereby, the welding process is not required in the assembly process so that the efficiency of the assembly of the connector 1 is improved.

Furthermore, electrically connecting the expanded circuit 240 with the transmission circuit 120 via each first terminal 300 and each second terminal 400 can limit crosstalk interference and electromagnetic interference while the transmission circuit 120 is transmitting the signal.

Additionally, when being plugged into or being separated from another connector, since the expanded circuit board 200 is fixed to the main circuit board 100 by each first terminal 300 and each second terminal 400, the expanded circuit board 200 does not swing with each first terminal 300 and each second terminal 400, thereby not increasing the possibility of the disconnection between the expanded circuit board 200 and each first terminal 300 as well as each second terminal 400. In contrast, this enhances the reliability of the connection structure between the main circuit board 100 and the expanded circuit board 200 when another connector is plugged in.

Figure 5A:
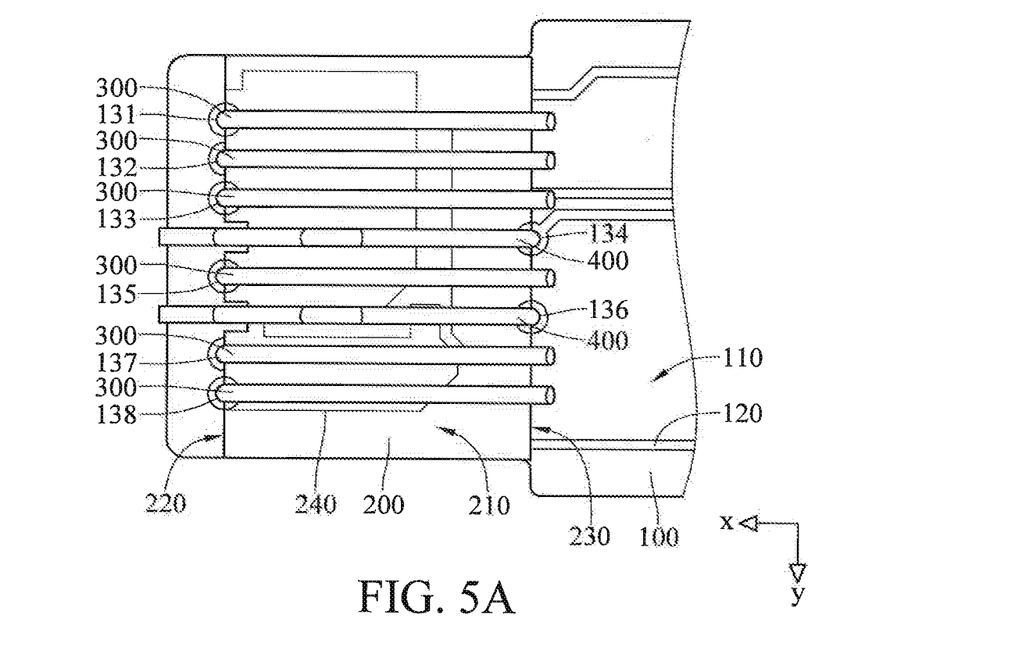
FIG. 5A is a partial top view of the transmission assembly of FIG. 4.

Now a further design of the arrangement of the first terminal 300 and the second terminal 400 for limiting the crosstalk interference will be illustrated. FIG. 5A is a partial top view of the transmission assembly of FIG. 4. As seen in FIG. 5A, in this embodiment, the total number of the first terminals 300 and the second terminal 400 is eight. The main circuit board 100 has a first socket 131 to an eighth socket 138 along the positive y-axis direction. Six first terminal 300 are plugged in the first socket 131, the second socket 132, the third socket 133, the fifth socket 135, the seventh socket 137 and the eighth socket 138 respectively, while two second terminals 400 are plugged in the fourth socket 134 and the sixth socket 136 respectively. That is, in this embodiment, one of the first terminals 300 is between the two second terminals 400, but the disclosure is not limited thereto.

Figure 5B:
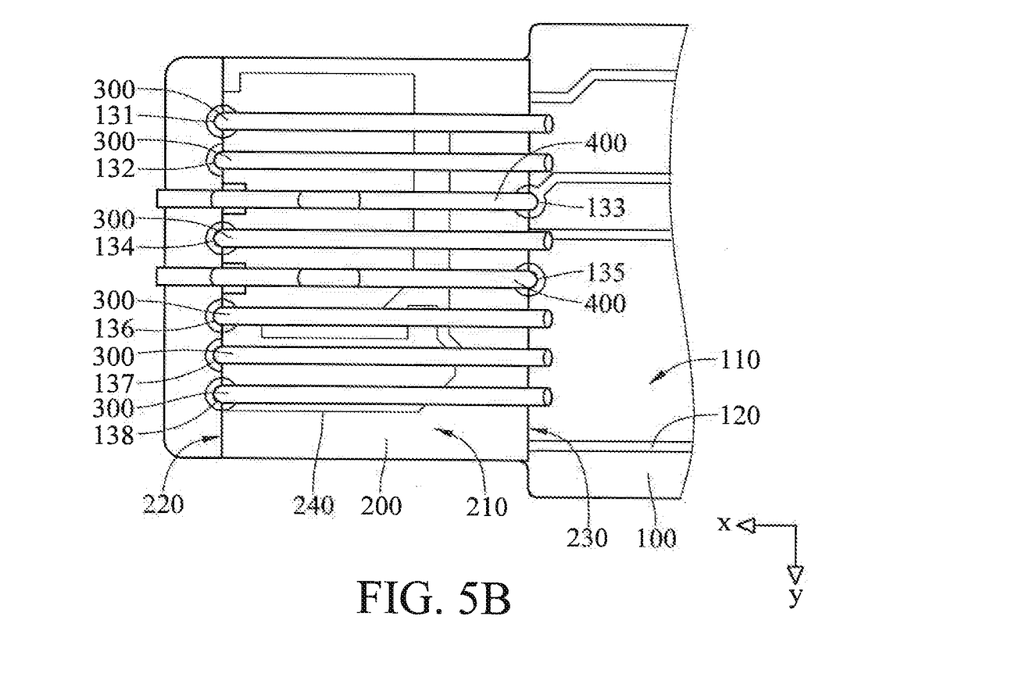
FIG. 5B is a partial top view of the transmission assembly according to the second embodiment of the disclosure.

FIG. 5B is a partial top view of the transmission assembly according to the second embodiment of the disclosure. As seen in FIG. 5B, in this embodiment, the total number of the first terminals 300 and the second terminal 400 is eight. The main circuit board 100 has a first socket 131 to an eighth socket 138 along the positive y-axis direction. Six first terminals 300 are plugged in the first socket 131, the second socket 132, the fourth socket 134, the sixth socket 136, the seventh socket 137 and the eighth socket 138 respectively, while two second terminals 400 are plugged in the third socket 133 and the fifth socket 135 respectively. Similarly, in this embodiment, one of the first terminals 300 is between the two second terminals 400.

Figure 5C:
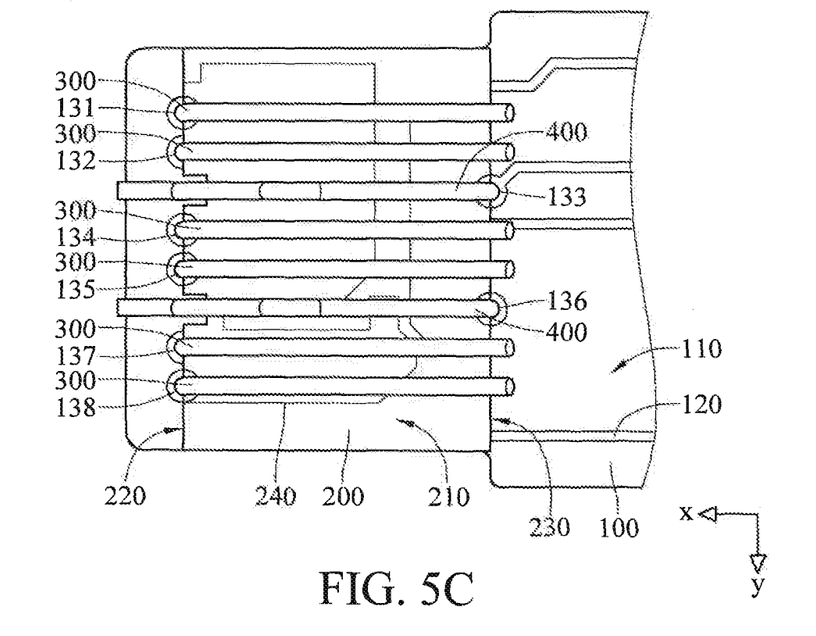
FIG. 5C is a partial top view of the transmission assembly according to the third embodiment of the disclosure.

FIG. 5C is a partial top view of the transmission assembly according to the third embodiment of the disclosure. As seen in FIG. 5C, in this embodiment, the total number of the first terminals 300 and the second terminal 400 is eight. The main circuit board 100 has a first socket 131 to an eighth socket 138 along the positive y-axis direction. Six first terminals 300 are plugged in the first socket 131, the second socket 132, the fourth socket 134, the fifth socket 135, the seventh socket 137 and the eighth socket 138 respectively, while two second terminals 400 are plugged in the third socket 133 and the sixth socket 136 respectively. Similarly, in this embodiment, two of the first terminals 300 are between the two second terminals 400.

Figure 5D:
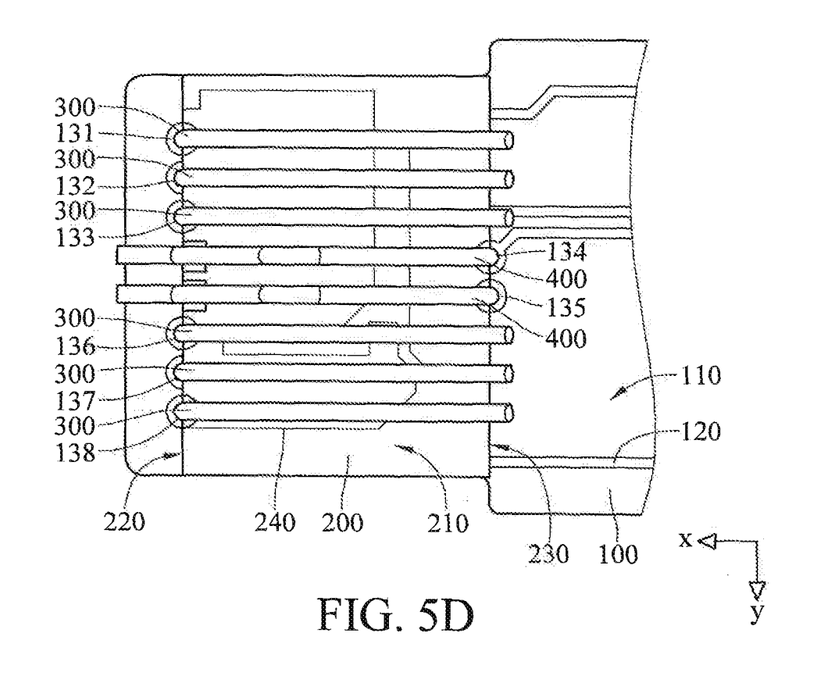
FIG. 5D is a partial top view of the transmission assembly according to the fourth embodiment of the disclosure.

FIG. 5D is a partial top view of the transmission assembly according to the fourth embodiment of the disclosure. As seen in FIG. 5D, in this embodiment, the total number of the first terminals 300 and the second terminals 400 is eight. The main circuit board 100 has a first socket 131 to an eighth socket 138 along the positive y-axis direction. Six first terminals 300 are plugged in the first socket 131, the second socket 132, the third socket 133, the sixth socket 136, the seventh socket 137 and the eighth socket 138 respectively, while two second terminals 400 are plugged in the fourth socket 134 and the fifth socket 135 respectively. Similarly, in this embodiment, the two second terminals 400 are adjacent to each other.

Now the assembly method of the connector 1 and the transmission assembly 20 will be illustrated for clarifying how convenient the assembly is. Referring to FIG. 6A to FIG. 6E, FIG. 6A to FIG. 6E are schematic side views of the assembly process of the transmission assembly of FIG. 4.

Figure 6A:
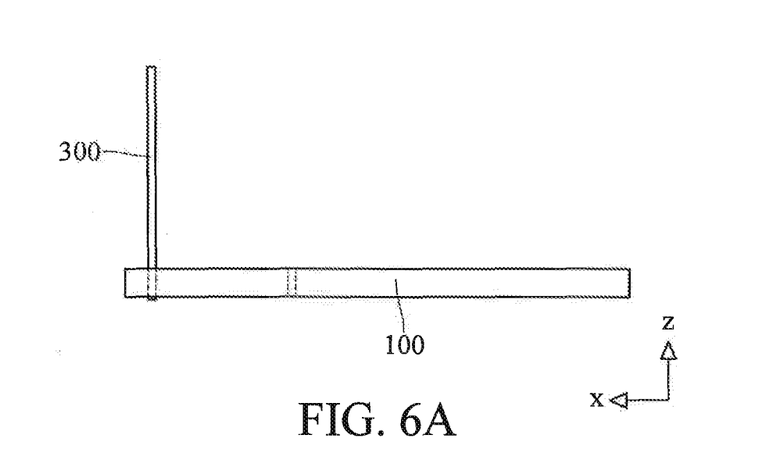
FIG. 6A to FIG. 6E are schematic side views of the assembly process of the transmission assembly of FIG. 4.

As seen in FIG. 6A, six first terminals 300 are plugged in the main circuit board 100.

Figure 6B:
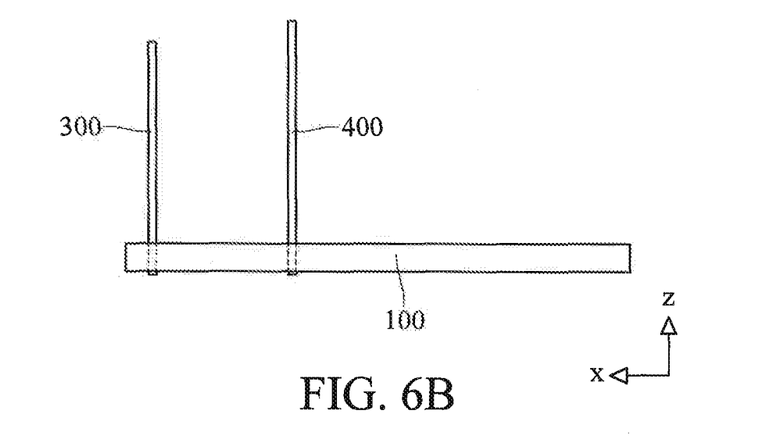

As seen in FIG. 6B, two second terminals 400 are plugged in the main circuit board 100.

Figure 6C:
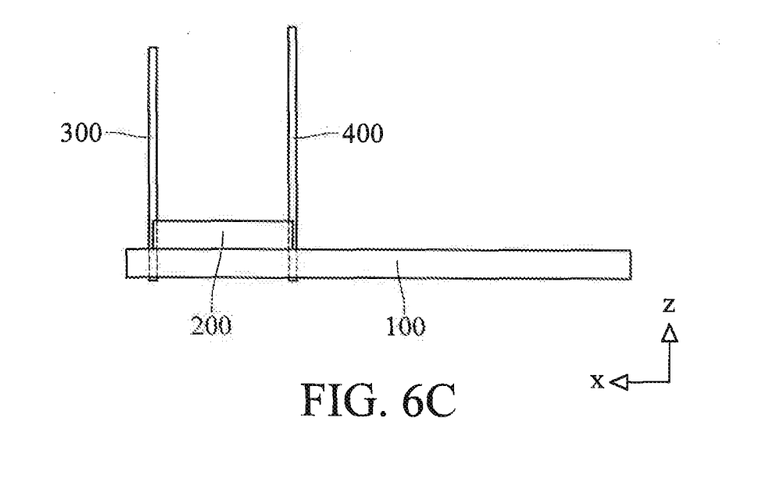

As seen in FIG. 6C, each first recessed portion 221 and each second recessed portion 231 of the expanded circuit board 200 slide along extending paths of each first terminal 300 and two second terminals 400 to stack on the main circuit board 100 of the expanded circuit board 200, while the expanded circuit board 200 is disposed between these first terminals 300 and the two second terminals 400.

Figure 6D:
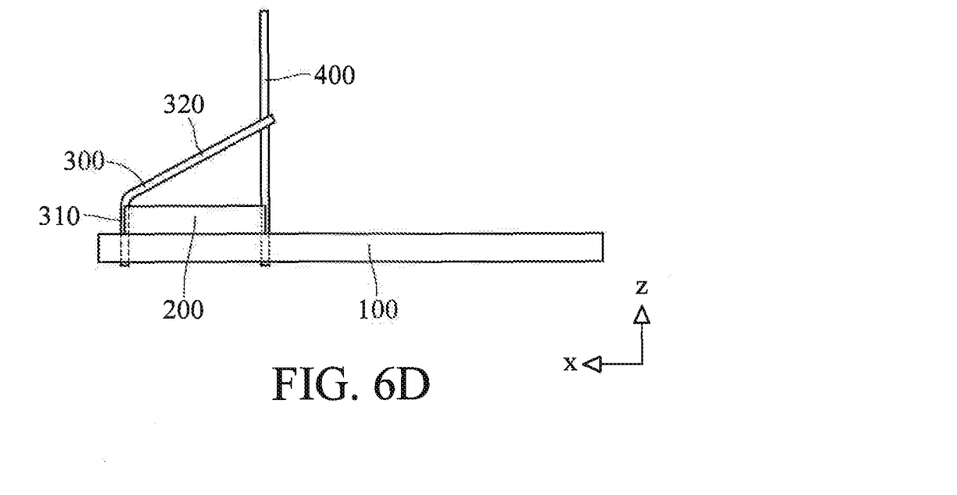

As seen in FIG. 6D, these first terminals 300 are bent for making each of them form a first limit section 310 and a first contact section 320. These first limit sections 310 are in electrical contact with the first electrical contacts 250 of the expanded circuit board 200 respectively, and the first contact sections 320 extend towards the second lateral side 230.

Figure 6E:
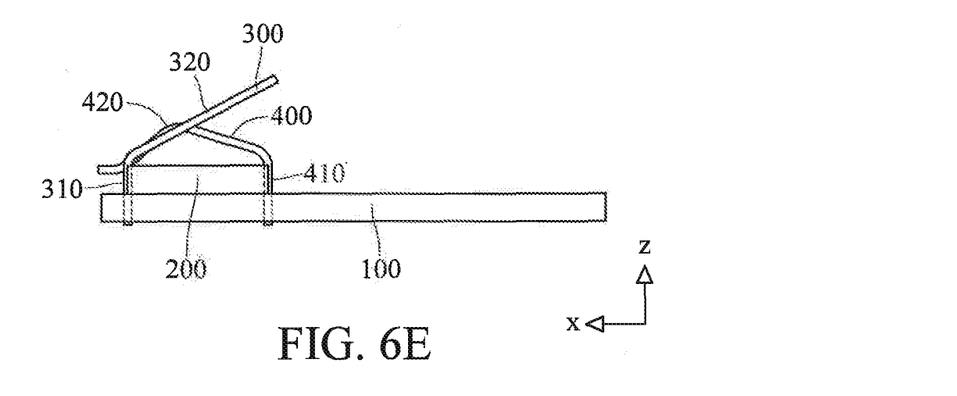

As seen in FIG. 6E, two second terminals 400 are bent for making each of them form a second limit section 410 and a second contact section 420. The two second limit sections 410 are in electrical contact with the second electrical contact 260 respectively. The second contact section 420 extends towards the first lateral side 220 and is pressed against one side of the expanded circuit board 200 away from the main circuit board 100, thereby completing the assembly of the transmission assembly 20.

However, bending the first terminal 300 before bending the second terminal 400 is not intended to limit the disclosure. In one embodiment, it is possible that the first terminal 300 is bent after the second terminal 400 is bent.

In the connector illustrated above, the expanded circuit board is directly fixed to and electrically connected to the main circuit board via the first terminal and the second terminal. Thus, the welding process is not required in the assembly process so that the efficiency of the assembly of the connector is improved.

Furthermore, the expanded circuit board can be a support plate for the first terminal and the second terminal while being disposed between them.

Additionally, plugging another connector into this connector or separating another connector from this connector may enhance the connection structure of the main circuit board and the expanded circuit board.

What is claimed is:

1. A RJ connector comprising:
an insulated housing having a slot; and
a transmission assembly located inside the insulated housing, wherein the transmission assembly comprises a main circuit board, an expanded circuit board, a plurality of first terminals and at least one second terminal, the expanded circuit board is stacked on the main circuit board and a first lateral side and a second lateral side of the expanded circuit board which are opposite to each other has a plurality of first electrical contacts and at least one second electrical contact, respectively, and the first terminals and the at least one second terminal are plugged in the main circuit board,
wherein one ends of the first terminals are in electrical contact with the first electrical contacts respectively, the other ends of the first terminals bend and extend towards the second lateral side of the expanded circuit board; one end of the at least one second terminal is in electrical contact with the at least one second electrical contact, the other end of the second terminal bends and extends towards the first lateral side of the expanded circuit board, while the other end of the second terminal is pressed against one side of the expanded circuit board away from the main circuit board, thereby fixing the expanded circuit board to the main circuit board and making the expanded circuit board and the main circuit board be electrically connected to each other,
wherein the main circuit board has a surface and a transmission circuit, the expanded circuit board is stacked on the surface, the expanded circuit board has an expanded circuit, the transmission circuit is electrically connected to the expanded circuit via the first terminals, the at least one second terminal, the first electrical contacts and the second electrical contact.

2. The RJ connector according to claim 1, wherein the expanded circuit board has a top surface, the first lateral side and the second lateral side are connected to the opposite two sides of the top surface respectively, the first terminals bend and form a first limit section and a first contact section, the at least one second terminal bends and forms a second limit section and a second contact section, one end of each first limit section and one end of the second limit section are plugged in the main circuit board, while the expanded circuit board is disposed between the other ends of the first limit sections and the other end of the second limit section which are in electrical contact with the first electrical contacts and the second electrical contact, respectively, and wherein at least a part of the second contact section is pressed against the top surface of the expanded circuit board.

3. The RJ connector according to claim 1, wherein the transmission assembly further comprises a plurality of piercing terminals, and the piercing terminals are plugged in the main circuit board and are electrically connected to the transmission circuit.

4. The RJ connector according to claim 1, wherein the insulated housing comprises:
- a main body has an accommodating notch, the slot connects the accommodating notch while the transmission assembly is located in the accommodating notch, and the slot exposes the first terminals and the second terminal;
- a top cover installed on the main body and covering the transmission assembly; an
- a back cover installed on the main body while the back cover and the main body together abut on opposite two sides of the main circuit board.

5. The RJ connector according to claim 1, wherein the number of the first electrical contacts is six, the number of the at least one second electrical contacts is two, the number of the first terminals is six, the number of the at least one second terminals is two, the first terminals are arranged in a first line, the two second terminals are arranged in a second line, and the first line and the second line are parallel to each other.

6. The RJ connector according to claim 5, wherein the two second terminals are adjacent to each other.

7. The RJ connector according to claim 5, wherein one of the first terminals is between the two second terminals.

8. The RJ connector according to claim 5, wherein two of the first terminals are between the two second terminals.

9. The RJ connector according to claim 5, wherein the first lateral side of the expanded circuit board has a plurality of first recess portions while the second lateral side has two second recess portions, the first electrical contacts are formed on the first recess portion while the two first electrical contacts are formed on the two second recess portions.

10. An assembly method for a transmission assembly of a RJ connector comprising steps of:
- plugging a plurality of first terminals in a main circuit board;
- plugging at least one second terminal in the main circuit board;
- stacking an expanded circuit board on the main circuit board, wherein a first lateral side and a second lateral side of the expanded circuit board which are opposite to each other has a plurality of first electrical contacts and at least one second electrical contact, respectively, and the expanded circuit board is disposed between the first terminals and the second bending the first terminals so that the first terminals each forms a first limit section and a first contact section, wherein the first limit sections are in electrical contact with the first electrical contacts, respectively, and the first contact sections extend towards the second lateral side; and
- bending the second terminal so that it forms a second limit section and a second contact section, wherein the second limit section is in electrical contact with the second electrical contact, while the second contact section extends towards the first lateral side and is pressed against one side of the expanded circuit board away from the main circuit board,
- wherein the main circuit board has a surface and a transmission circuit, the expanded circuit board is stacked on the surface, the expanded circuit board has an expanded circuit, the transmission circuit is electrically connected to the expanded circuit via the first terminals, the at least one second terminal, the first electrical contacts and the second electrical contact.

* * * * *